US006428939B1

(12) United States Patent
Yang et al.

(10) Patent No.: US 6,428,939 B1
(45) Date of Patent: Aug. 6, 2002

(54) ENHANCED BRIGHT PEAK CLEAR PHASE SHIFTING MASK AND METHOD OF USE

(75) Inventors: Lei Yang, Madison; James W. Taylor, Cross Plains; Francesco Cerrina, Madison, all of WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/813,343

(22) Filed: Mar. 20, 2001

(51) Int. Cl.$^7$ .............................. G03F 9/00; G21K 5/00
(52) U.S. Cl. .............................................. 430/5; 378/35
(58) Field of Search ..................... 430/5, 322; 378/34, 378/35; 716/19, 21

(56) References Cited

U.S. PATENT DOCUMENTS

| | | | |
|---|---|---|---|
| 4,035,522 A | 7/1977 | Hatzakis | 427/43 |
| 4,185,202 A | 1/1980 | Dean et al. | 250/492 |
| 4,890,309 A | 12/1989 | Smith et al. | 378/35 |
| 5,187,726 A | 2/1993 | White | 378/35 |
| 5,239,408 A | 8/1993 | Hackel et al. | 359/338 |
| 5,503,950 A | 4/1996 | Miyake et al. | 430/5 |
| 5,809,103 A | 9/1998 | Smith et al. | 378/35 |
| 6,122,037 A | 9/2000 | Wagner | 355/67 |

*Primary Examiner*—S. Rosasco
(74) *Attorney, Agent, or Firm*—Boyle Fredrickson Newholm Stein & Gratz S.C.

(57) ABSTRACT

A clear phase shifting mask, particularly adapted to imaging nanostructures using X-ray lithography, includes a membrane having generally planar top and bottom surfaces the membrane being substantially transparent to the incoming radiation. In addition, the mask includes a pair of phase shift regions supported on the membrane, each of the regions defining a corresponding edge. During an imaging operation, the mask generates an aerial image defining, for each of the corresponding edges, an edge bright peak and an edge dark peak. By suitable choices of widths on the mask, the edge bright peaks can be caused to constructively interfere to form an enhanced intensity image bright peak. According to another embodiment, aphase shifting mask that images two-dimensional features on a target using the bright peak of the corresponding aerial image includes a membrane and a phase shifting material supported by the membrane. The phase shifting material defines an aperture that includes two pairs of opposed edges, each pair being separated by an associated perpendicular distance that is selected to facilitate constructive interference of the edge bright peaks to produce an enhanced intensity image bright peak that is used to image the two-dimensional feature.

72 Claims, 6 Drawing Sheets

ENHANCED BRIGHT PEAK CLEAR PHASE SHIFTING MASK AND METHOD OF USE

BACKGROUND OF THE INVENTION

1. Field of the Invention

The present invention is directed to high resolution lithography for the fabrication of nano-electronic devices and, more particularly, the manufacture and use of clear phase shifting masks for lithographic processes that enhance the bright-peak of the corresponding aerial image of the mask.

2. Description of the Related Art

Semiconductor computer chips typically include millions of devices fabricated on a single chip. These devices are defined at least in part by linear features or nodes that can be imaged on a wafer of the chip using a photolithographic process, typically comprising a number of steps for depositing multiple layers of materials. For example, trench features are often imaged on the wafer and then filled with metal to provide conductive traces on the chip.

The speed of semiconductor computer chips, such as the Intel Pentium® chip is dependent on the width of these linear features or nodes imaged on the associated wafer during production. As nodes are made smaller, more nodes can be placed on a chip and the processing speed increases. This technology has developed rapidly. For example, the Pentium® 3 chip has a nominal node size of approximately 180 nanometers (nm) and the Pentium® 4 chip has a nominal node size of approximately 120 nm.

A favored method for making these small nodes on chips includes placing a mask above a target (i.e., the chip) which comprises, for example, a silicon or GaAs substrate having a photoresist disposed thereon, and exposing the photoresist to light in a photolithographic technique. Notably, when writing features to a target in this fashion, the lithography process typically generates two types of images, an aerial image (i.e., the radiation intensity of the target surface), and a latent image (i.e., the image recorded in the target photoresist.)

With lithography techniques, the wavelength of the light utilized to form the image on the target photoresist imposes a fundamental limit on the achievable image definition or resolution, i.e., the minimum node width that can be imaged. One limiting factor in making smaller nodes has to do with diffraction, which is an unwanted side effect of the lithography production process. In particular, the image resolution is limited by diffraction of the light at the edges of the features of the masks through which the light is projected. To lessen the negative effects associated with diffraction, and thus allow the creation of smaller nano-electronic structures that are obtainable using visible or UV optical systems, sources that generate short-wave length light rays (e.g., X-rays) are being implemented.

Moreover, as the distance between the mask and the wafer increases, the diffraction of the light waves increases, so the feature produced on the chip is slightly larger than the feature on the mask. Therefore, typically, the smaller separation or gap between the mask and the photoresist, the less diffraction.

Ideally, you would eliminate diffraction by placing the mask directly on the target surface (a technique known as "contact printing"), but for several reasons this is not practical. For instance, the mask is fragile, and the photoresist may be sticky, so removing the mask from the surface after processing becomes difficult. Also, the additional time required in process (due to, for example, using extra care when coupling/separating the mask from the substrate) would decrease yield, as well as increase cost per part. In addition, the target and the mask both may have some amount of curvature, which makes it difficult to couple them and completely eliminate the gap.

Therefore, to further minimize the negative effects associated with diffraction, phase shifting masks (PSMs) may be used. PSMs enhance the imaging resolution of features to be printed on a wafer surface by exploiting a phase difference (e.g., a π-phase difference) between a phase shifting region and an open region both residing on the surface of a mask membrane. In particular, the phase difference causes interference between phase shifted and non-phase shifted radiation when writing features using the phase shifting mask. This interference occurs on both sides of an edge of the phase shifting regions, and can be observed by analyzing the corresponding aerial image. Typically, the image includes a "bright peak" and a "dark peak" associated with the edge.

In PSMs, two types of phase shift regions are typically employed, clear phase shift regions, and attenuating phase shift regions. Existing clear PSMs focus on compensating for diffraction by using "dark peak" interference waves to image the mask pattern onto the photoresist.

Note that a clear PSM is characterized by comprising phase shifting material that does not substantially attenuate the source radiation (e.g., X-rays) passing therethrough. To the contrary, attenuating PSMs typically comprise an attenuator that absorbs a significant portion of the radiation impinging thereon, thus generating the desired phase shift of that portion of the radiation passing therethrough. A suitable heavy metal absorber, such as Gold (Au) may be made of Tungsten (W) having an appropriate thickness. A drawback associated with attenuating PSMs is that they typically reduce the radiation intensity when imaging mask features. By providing more power to the wafer, clear PSMs require shorter exposure times, and thus facilitate greater wafer throughput.

A typical phase mask and its associated aerial image are shown in FIGS. 1A and 1B, respectively, for the case in which phase X-ray lithography (PXRL) is employed. A mask 10 includes a carrier or membrane 12 having generally planar top and bottom surfaces 14, 16, respectively. Membrane 12 supports a phase shift region 18 defining an edge 20 and is made of a suitable material such as polymethylmethacrylate (PMMA) having a thickness of about 2.5 to 3 µm such that it provides the desired half wavelength (i.e., "π") phase shift for a corresponding band of X-ray photons of approximately 1.0 nm in wavelength. Edge 20 defines a boundary line between phase shift region 18 and an open region 21 supported by membrane 12. In this case, membrane 12 is preferably made of silicon nitride ($Si_3N_4$) which is sufficiently thin not to absorb greatly the incoming radiation flux (e.g., 22 in FIG. 1A). Further, the gap between the mask and the target resist (not shown) is typically about 15 µm or less.

An aerial image 24 produced by this arrangement is shown in FIG. 1B and is plotted as Normalized Intensity versus Dimension (nm) on the target. Image 24 includes a bright peak 32 and a dark peak 26. In known PXRL systems, dark peak interference is used to compensate for the diffraction at the mask edge, and thus it is the dark peak 26 that is used to image the feature. More particularly, when imaging a node to the target, destructive interference of the spatially coherent phase shifted and non-phase shifted X-rays results in their fields canceling near the boundary line 20 so that the intensity of X-ray energy absorbed by the target photoresist reaches a minimum at a point 26 (i.e., the dark peak) which lies generally on boundary line 20. Preferably, the energy absorption represented by point 26 is below the exposure threshold energy level $E_1$, of the resist; that is, those areas of the resist which receive photon energy below the level of the line $E_1$ illustrated in FIG. 1B will not, for a positive resist, be dissolvable by a developer solvent. The developer will, however, dissolve the regions of the target photoresist to the left of a point 28 at which the threshold $E_1$ intersects the exposure level curve 24 and to the right of a point 30 at which the threshold $E_1$ intersects curve 24. For a more detailed analysis of this technique, see U.S. Pat. No. 5,187,726 issued on Feb. 16, 1993, to Wisconsin Alumni Research Foundation. This technique typically uses the dark peak 26 to image lines in positive-tone resists, or trenches in negative-tone resist.

As mentioned previously, aerial image 24 also includes a bright peak 32. When using a photoresist having a threshold level $E_2$, energy absorption by the resist that is greater than $E_2$ could theoretically be used to image nodes. However, the bright peak 32 is not normally used because its intensity is not sufficiently higher than the dark peak 26, and its contrast is poorer. If, however, these two limitations could be obviated, it would be possible to use the bright peak for imaging as well.

Moreover, typical phase shifting schemes involving a PSM are alternating aperture PSM, attenuated PSM, or clear PSM. As discussed above, X-rays have been employed with the conventional one-to-one masks such as these to circumvent some diffraction effects because of the shorter wavelength of the X-rays. However, all these phase shifting schemes, including the application with X-rays, have been limited to one-dimensional resolution enhancement. For two-dimensional patterns, such as contact holes (or vias), conventional phase shifting alone is not a viable solution.

As a result, the field of semiconductor fabrication using lithography is in need of an apparatus and method that overcomes both the limitations associated with using the dark peak of an aerial image to image nodes in a target, as well as overcome the limitations associated with narrow mask-to-wafer gaps. Further, such a system should be capable of imaging both one-dimensional and two-dimensional patterns without compromising production efficiency and reliability.

SUMMARY OF THE INVENTION

The preferred embodiment is directed to a clear phase shifting mask and method of use that specifically enhances the bright peak of the aerial image generated by the mask by appropriately positioning two adjacent phase shifting edges so that they give rise to constructive interference between the bright peaks associated with the individual edges. As a result, the written mask feature can be larger than the printed feature by a factor of 3 to 5. In addition, this relaxes the constraints on writing small features on the mask. Moreover, the constraints on the gap distance between the mask-to-wafer are lessened. In fact, in the preferred embodiment, gaps are preferably larger than those currently used in X-ray lithography utilizing PSMs, thus further facilitating efficient production of reliable chips including nano-electronic devices. Also, the preferred embodiment is adapted to imaging both one-dimensional and two-dimensional patterns using appropriately positioned phase shift regions. Note that the terms "one-dimensional" and "two-dimensional" are herein used to refer to the number of critical dimensions (CDs) associated with the nanostructure being produced; for example, trenches are characterized as having one CD, and therefore are referred to as one-dimensional, while a contact hole is a two-dimensional pattern.

According to a first aspect of the preferred embodiment, an X-ray phase mask includes a membrane having generally planar top and bottom surfaces, the membrane being substantially transparent to X-rays. In addition, the mask includes a pair of clear phase shift regions supported on the membrane, each of the regions defining a corresponding edge. During an imaging operation, the mask generates an aerial image defining, for each of the corresponding edges, an edge bright peak and an edge dark peak, the edge bright peaks constructively interfering at a certain distance from the mask to form an enhanced bright peak.

In another aspect of the preferred embodiment, the edges of the clear phase shift regions are separated by a perpendicular distance that is based on the effective wavelength of the X-rays. The perpendicular distance is between about 100 nm and 300 nm when the effective wavelength is about 0.9 nm. Moreover, in the preferred embodiment an image bright peak is used to produce a structure having a critical dimension less than or equal to 50 nm.

According to another aspect of the preferred embodiment, a phase mask includes a membrane having generally planar top and bottom surfaces, and a phase shift material supported by the membrane and defining an open region, wherein the open region defines a feature of the mask. During an imaging operation, radiation propagating through the mask constructively interferes to produce an image bright peak that images the feature in a target photoresist.

According to a still further aspect of the preferred embodiment, a method of producing a nanostructure by lithography includes providing a phase shifting mask defining a feature, and a target positioned parallel to the mask and separated therefrom by a gap. Next, the method includes exposing the phase shifting mask and the target to a beam of radiation such that the corresponding aerial image includes an image bright-peak. The image bright-peak is then used to image the feature on the target.

According to a further aspect of the preferred embodiment, a phase shifting mask for imaging a feature on a target includes a membrane having generally planar top and bottom surfaces. In addition, the mask has first and second phase shift regions supported on the membrane that define corresponding first and second edges. Moreover, the first and second edges are separated by a distance selected so that an aerial image generated by the mask during an imaging operation includes corresponding first and second bright peaks that constructively interfere, where the first and second bright peaks corresponding to the first and second edges.

In yet another aspect of the preferred embodiment, a phase shifting mask that images a two-dimensional feature on a target includes a membrane and a clear phase shifting material supported by the membrane. The phase shifting material defines an aperture that includes two pairs of opposed edges, each pair being separated by an associated perpendicular distance. During an imaging operation, the mask generates an aerial image comprising an edge bright peak associated with each edge Moreover, each associated perpendicular distance is selected to facilitate constructive interference of the edge bright peaks to produce an image bright peak that is used to image the two-dimensional feature.

According to a still further aspect of the preferred embodiment, a method of imaging a two-dimensional mask feature by lithography includes providing a phase shifting mask defining a two-dimensional feature and a target positioned parallel to the mask and separated therefrom by a gap. Next, the method includes exposing the phase shifting mask and the target to a beam of radiation such that the corresponding aerial image includes an image bright-peak that is used to image the two-dimensional feature on the target.

According to another aspect of the preferred embodiment, the aperture is defined by two pairs of opposed clear π-phase shift regions, each phase shift region defining a corresponding edge, the corresponding edges of each pair being generally parallel to each other and separated by a distance.

These and other objects, features, and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

DESCRIPTION OF THE DRAWINGS

The present invention will become more fully understood from the following detailed description, taken in conjunction with the accompanying drawings, wherein like reference numerals refer to like parts, in which.

DETAILED DESCRIPTION OF THE PREFERRED EMBODIMENTS

Figure 2:
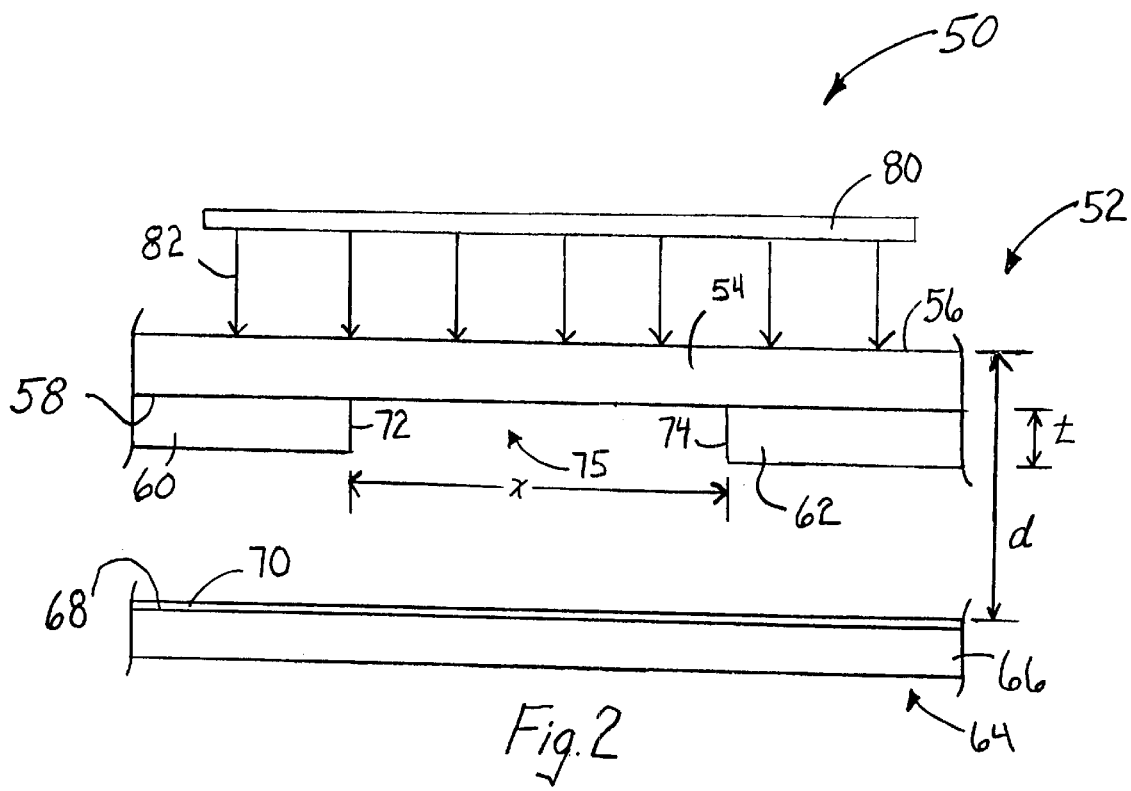
FIG. 2 is a partially broken away cross-sectional schematic view of a phase shifting mask according to the preferred embodiment, illustrating an open window region defined by adjacent edges of two π-phase shifting regions separated by a perpendicular distance where the interaction of two edge bright peaks do not constructively interfere.

Turning initially to FIG. 2, a schematic cross-sectional view of a preferred embodiment of an apparatus 50 for producing nano-electronic structures (i.e., nodes) using a lithographic process is shown. Apparatus 50 employs a phase mask 52 including a thin membrane 54 having top and bottom surfaces 56, 58, respectively. Bottom surface 58 of membrane 54 includes first and second clear phase shift regions, 60, 62, supported by bottom surface 58. Membrane 54 is preferably a carrier of silicon nitride ($Si_3N_4$) that is sufficiently thin (e.g., about 2 micrometers or less) such that it does not significantly absorb the incoming radiation during exposure. Other suitable membrane materials include silicon carbide (SIC), and diamond. These mask materials have desirable properties in that they are not easily damaged by the X-ray beam of an X-ray source, the radiation source used in the preferred embodiment (discussed below). In particular, SiC and diamond can be produced with additives to control the stress of membrane 54 to enhance stability when exposed to an X-ray beam. However, these materials are currently in relatively short supply, and are not as easy to work with as silicon nitride (e.g., conforming to design parameters, etc.).

Apparatus 50 also includes a target 64 to which the nodes are imaged. Target 64 includes a semiconductor substrate 66, for example, positioned generally parallel to mask 52 and displaced therefrom by a gap distance "d." Substrate 66 includes a top surface 68 that supports a layer of target photoresist 70 that selectively absorbs photons during the imaging process. Resist layer 70 can have a thickness between 120 nm and 10 microns, and more preferably, between 120 nm and 170 nm. In the preferred embodiment, a positive resist 70 is employed due to its high sensitivity to the bright peak. Further, although PMMA is one of the highest resolution resists known in the art, it is the most insensitive. In order to expose PMMA, a dose approximately equal to 3,000 millijoules/$cm^2$ is required. To the contrary, the chemically-amplified resists preferably employed in the preferred embodiment require only 50 millijoules/$cm^2$, if available resists are used such as those supplied by Shipley Company.

Clear phase shift regions 60, 62 include sidewalls or edges 72, 74, that are preferably well-defined intersections between the phase shifting material and an open region or window region 75 defined by sidewalls 72, 74, as shown in FIG. 2. Phase shift regions 60, 62 are relatively transparent to the incoming photons during the lithography process, while the thickness "t" of the phase shift regions 60, 62 is selected so that the photons which pass through regions 60, 62 are phase shifted by approximately ½ wavelength (i.e., a π-phase shift) relative to those photons which pass through window region 75 of mask 52 in which there is no phase shift material. Note that this π-phase shift is also dependent upon the wavelength of source radiation and the type of material used for regions 60, 62, as discussed below.

Notably, edges 72, 74 of π-phase shift regions 60, 62, respectively, are separated by a perpendicular distance marked "x." Further, sidewalls 72, 74 of π-phase shift regions 60, 62, are substantially parallel to the direction of propagation of the incoming photons during process. Generally, phase shifting regions 60, 62 facilitate writing a single feature on target 64 using the bright peak of an aerial image associated with mask 52, as discussed in further detail immediately below.

When imaging a feature defined by phase shifting mask 52 shown in FIG. 2, a source 80 directs radiation 82 toward top surface 56 of phase mask 52 such that the photons passing through phase shift regions 60, 62 are π-phase shifted, while the radiation passing through window region 75 is not shifted prior to contacting the layer of photoresist 70 on target 64. As a result, as in PXRL systems that utilize the dark peak of the aerial image to image nanostructures, the spatially coherent phase shifted and non-phase shifted rays destructively interfere at a position generally corresponding to edges 72, 74. The aerial image created thereby includes a pair of dark peaks associated with edges 72, 74, as well as a pair of edge bright peaks.

Figure 1A:
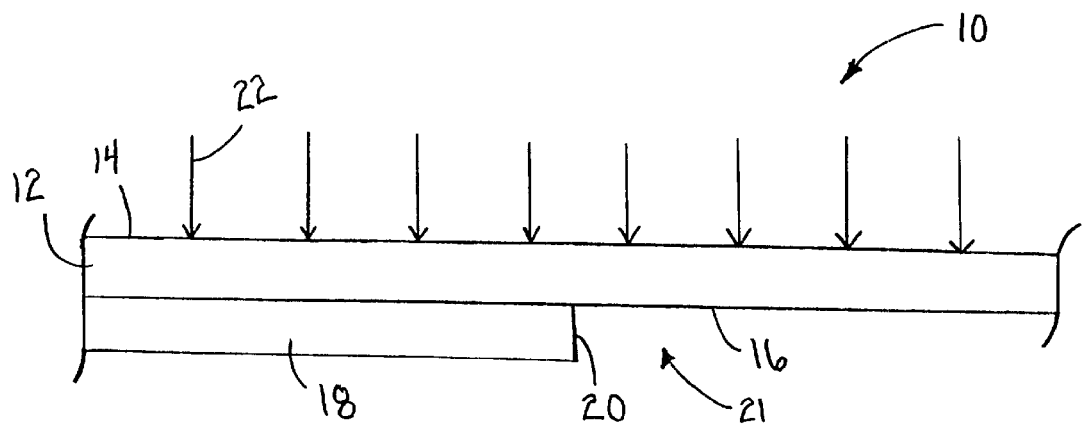
FIG. 1A is a partially broken away cross-sectional schematic view of a conventional phase shifting mask.
Figure 1B:
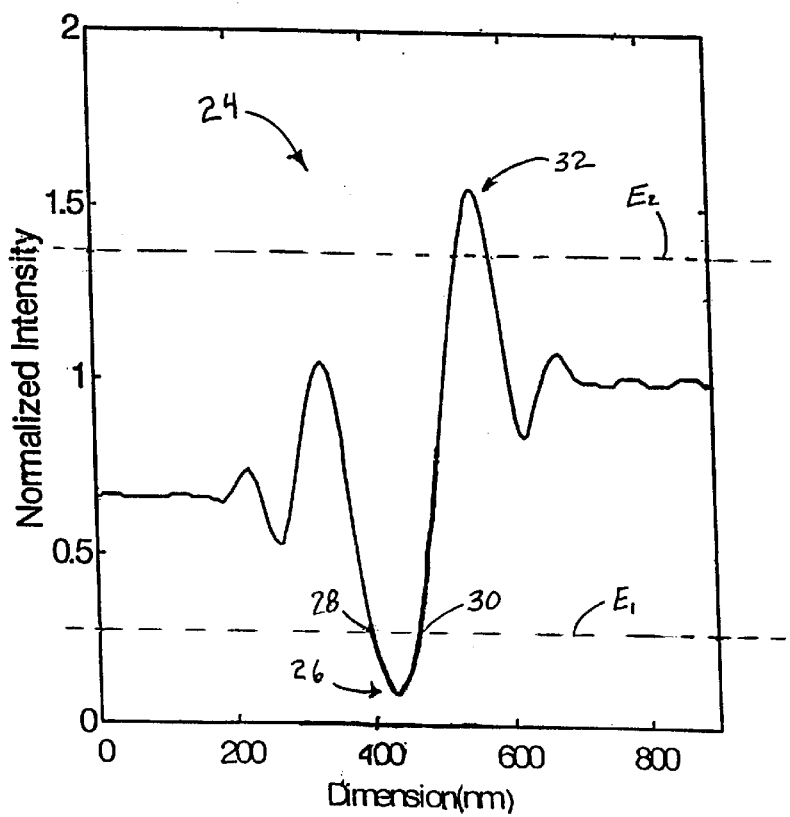
FIG. 1B is a graph illustrating the aerial image generated when using the phase shifting mask shown in FIG. 1A.
Figure 3A:
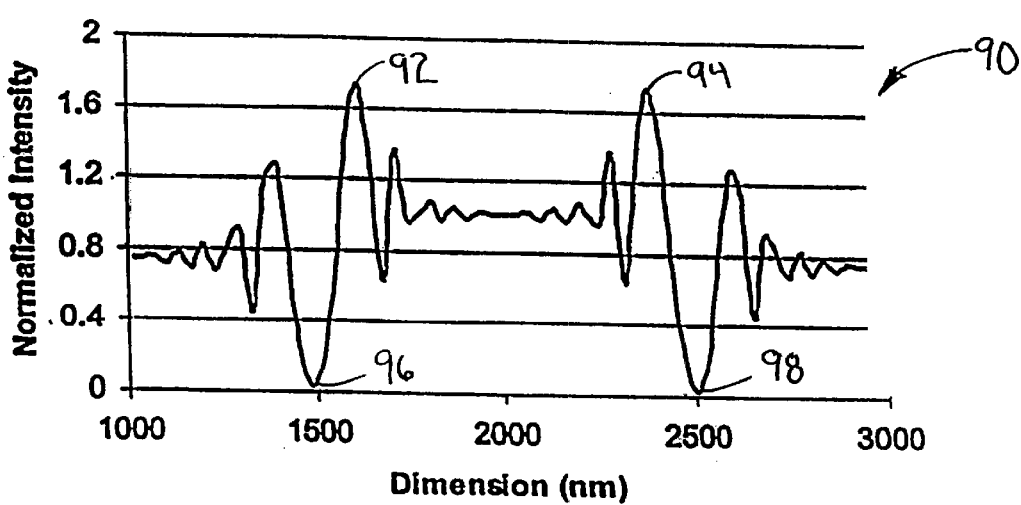
FIG. 3A is a graph illustrating the aerial image generated when using the phase shifting mask of FIG. 2 for a first perpendicular distance where the two edge bright peaks do constructively interfere.

More particularly, turning to FIG. 3A, a graph illustrating an aerial image 90 produced by apparatus 50 when source 80 is an X-ray source, and the perpendicular distance x, which defines window region 75 of mask 52, is about 1.000 nm. Image 90 includes a pair of edge bright peaks 92, 94 and a pair of dark peaks 96, 98 created as the spatially coherent X-rays destructively interfere near edges 72, 74. When using a positive-tone photoresist 70, dark peaks 96, 98 (similar to dark peak 26 generated by mask 12 shown in FIG. 1) could be used to image two lines separated by approximately 1,000 nm in target 64, as in known systems.

Figure 3B:
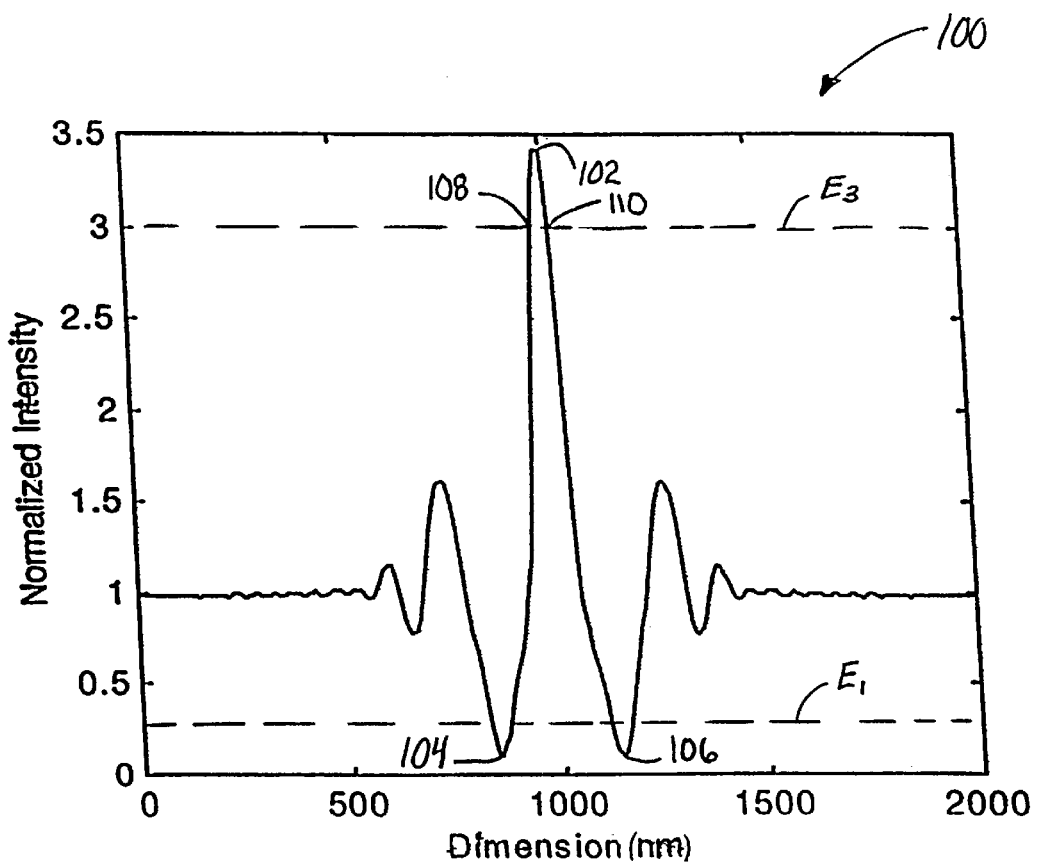
FIG. 3B is a graph illustrating the aerial image of the preferred embodiment generated when using the phase shifting mask of FIG. 2 for a different perpendicular distance.

However, in the preferred embodiment, regions 60, 62 are brought closer together so that the peaks of aerial image 90 shown in FIG. 3A interfere with one another. Preferably, the distance x is selected so that edge bright peaks 92, 94 of aerial image 90 associated with mask 52, and particularly phase shift regions 60, 62, respectively, constructively interfere. In particular, regions 60, 62 are positioned so that perpendicular distance x is between about 100 nm and 300 nm, such that the bright peaks 92, 94 of aerial image 90 shown in FIG. 3A constructively interfere to facilitate generation of an aerial image 100 having an image bright peak 102, and a pair of dark peaks 104, 106, as shown in FIG. 3B. The use of the term "image bright peak" herein is understood to mean a bright peak having an enhanced intensity. Notably, dark peaks 104, 106 of image 100 correspond to dark peaks 96, 98, respectively, of image 90 shown in FIG. 3A. An enhanced intensity image bright peak 102 having a normalized intensity of over three is achievable when the perpendicular distance x is about 250 nm.

With continued reference to FIG. 3B, enhanced intensity image bright peak 102 is used to image a node (e.g., a nano-electronic line or trench) in photoresist 70 of target 64. Notably, bright peak 102 is noticeably sharper than dark peaks 104 and 106, thus allowing the preferred embodiment to generate a sharp, high-contrast image of the mask feature defined by window regions 75. More particularly, because bright peak 102 has a high normalized intensity, a photoresist having a threshold equal to $E_3$ corresponding to a normalized intensity of about three can be used. If a positive-tone resist is employed, as is preferred, that region of the photoresist that is exposed to energy greater than the threshold level $E_3$ will be dissolvable by the appropriate developer solvent, thus forming a trench. This occurs over the range defined by points 108 and 110, which are the two points that the energy threshold level intersects the image bright peak 102 of the aerial image 100. The range defined by points 108 and 110 is indicative of the achievable CD, i.e., image resolution. Of course, in real photoresists, the exposure threshold is not a narrowly defined line as shown in FIG. 3B, but typically varies over a finite transition zone. Therefore, when the resist is removed by the developer solvent after exposure, the structure (in this case, a trench) which is defined by the resist 70 remaining on the substrate 66 (FIG. 2) will not have perfectly vertical sidewalls at the points 108 and 110, but rather somewhat sloping sidewalls. As a result, it is preferred that the resist threshold $E_3$ intersect the peak 102 in a narrowly defined region so that the sidewall structures are as vertical and sharply defined as possible.

Figure 4:
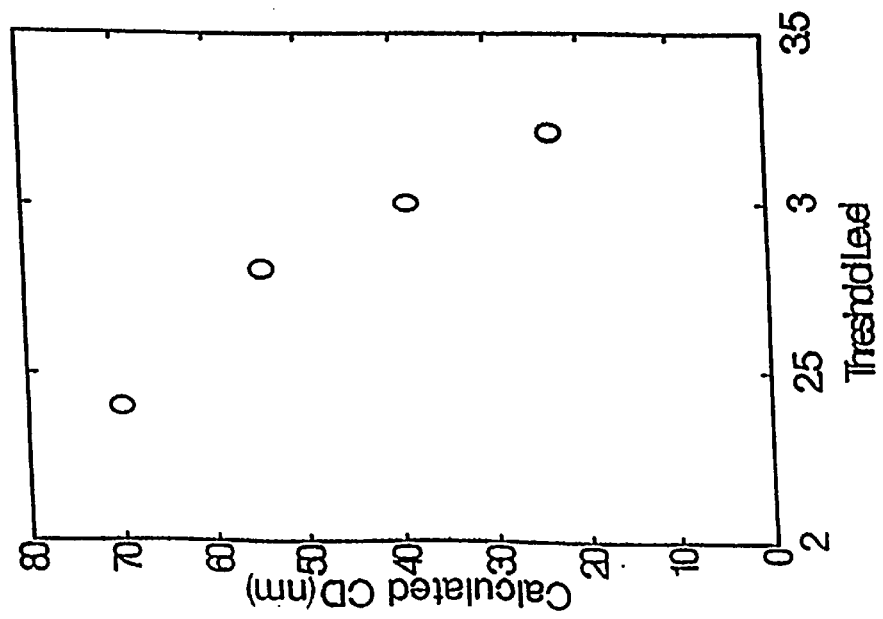
FIG. 4 is a graph illustrating the critical dimension (CD) obtainable when using photoresists having different corresponding threshold levels.

As shown in FIG. 4, as the threshold level at which the photoresist reacts to the bright peak is increased, improvements in calculated critical dimension (CD), in nanometers, are realized. In FIG. 4, calculated CD achieves 50 nm resolution at a threshold level having a normalized intensity of about three. As a result, the lithography apparatus 50 shown in FIG. 2 can be used to produce nanostructures that are less than or equal to 50 nm by using the image bright peak (e.g., 102 in FIG. 3B, which does have a peak normalized intensity greater than three) of the corresponding aerial image produced.

Further, source 80 emits substantially collimated radiation. Preferably, a synchrotron X-ray source is employed that has a highly collimated and broadband spectrum X-ray flux. Alternatively, for example, a point X-ray source could be employed.

X-ray sources are preferred because such sources allow for the creation of smaller nano-electronic structures than are obtainable utilizing visible or ultraviolet optical systems. The synchrotron provides an intense, steady beam of substantially collimated X-ray photons having a mixture of wavelengths spanning soft-to-hard X-rays. For the aerial images shown in FIGS. 3A and 3B, a synchrotron X-ray source generating X-rays having an effective wavelength of approximately 1.0 nm was used.

Note also that the photoresist dose, in terms of flux per unit area, required for producing nano-electronic devices using bright peak enhanced phase shifting mask 52 of the preferred embodiment is significantly smaller than that of a conventional phase mask because of the enhancement achieved by the constructive interference between the edge bright peaks of the aerial image produced by the two phase shifting regions (for example, 60, 62 in FIG. 2).

Importantly, in the preferred embodiment, the mask feature to be imaged can be larger than the printed feature by a factor of 3–5, thus relaxing the constraints on writing the mask as noted previously. In addition, it has been realized that using the preferred embodiment relaxes the constraints on the spacing or gap d between the mask to wafer, as compared to printing semiconductor features using a conventional X-ray mask, as discussed below in conjunction with FIGS. 4 and 5.

Note that the spacing between edges 72, 74 of shift regions 60, 62 (i.e., distance x) can be adjusted based on the radiation wavelength of source 80, and on the type of phase shifting material utilized. In addition, exposure conditions including exposure dose, developer type and normality, development time and developer temperature, and post-exposure bake time and temperature can often affect optimum spacing between regions. In particular, the chemically-amplified resists employed in the preferred embodiment require that each of these variables be optimized, according to an associated recipe, so that the resist appropriately responds to the corresponding bright peak to image the desired feature. For instance, the higher the baking temperature, the greater the spread of the acid that causes the chemical reaction. In this case, for a positive-tone resist, therefore, the higher temperature typically yields a wider image. On the other hand, temperature variations of a few degrees during the development stage of the process typically has little effect.

Unlike prior phase shifting masks that typically utilize polymethyl methacrylate (PMMA) for the phase shift material which provides the desired half wavelength phase shift for a suitable band of X-ray photons if it is formed in a film having a depth between 2.5 and 3 $\mu$m, regions 60, 62 are preferably made with a semiconductor material. The PMMA polymer makes it more difficult to obtain straight edges for phase shift regions 60, 62, and such a mask is not as robust as one formed with semiconductor materials.

There are two criteria preferably considered when picking the material to be used for the phase shift regions 60, 62. First, the thickness of phase shift region 60, 62 should be as low as possible so that edges 66, 68 respectively, can be made as straight and upright as possible, i.e., perpendicular to the upper and lower surfaces of membrane 54, and thus generally parallel to the incoming radiation flux. The thickness is selected to provide the appropriate pi-phase shift, and the thicker the phase shift region is, the more slope it has. Ultimately, this detrimentally affects the achievable critical dimension (CD), as can be appreciated by one skilled in the art. Next, in picking a phase shift material, consideration should be given to the amount of transmission of, for example, X-ray photons therethrough. Notably, however, for bright peak phase shift mask 52, high transmission is not as critical to operation. Rather, it is more critical that the phase shift regions 60, 62 be clear phase shift regions, and not the attenuating-type phase shifters that are typically employed in prior art systems. Table 1 considers these criteria for a number of potential materials.

TABLE 1

Phase Shifter Materials (for effective wavelength of 0.9 nm)

| Materials | Thickness ($\mu$m)* | Transmission (%) |
|---|---|---|
| TiN | 0.85 | 37.26 |
| $Al_2O_3$ | 1.16 | 59.15 |
| $Si_3N_4$ | 1.27 | 66.66 |
| SiC | 1.42 | 72.56 |
| Al | 1.97 | 77.32 |
| Si | 3.11 | 73.54 |

*Thickness needed to produce $\pi$-phase shift.

Each material typically has a particular absorption that may range from 35% to over 75%. For the present application, a thickness of less than 1.5 $\mu$m and a minimum transmission percentage of about 65% is preferred. As shown in Table 1, the required thickness for the $\pi$-phase shift regions with 0.9 nm radiation, and the corresponding transmission percentage are shown for a number of different materials. For example, although silicon carbide (SiC) has a desirable thickness of 1.42 $\mu$m, and very good transmission percentage of 72.56% for an effective wavelength of X-rays of about 0.9 nm, SiC is in relatively short supply. Therefore, one preferred choice for the phase shifting material is silicon nitride ($Si_3N_4$), which has a very good thickness of 1.27 microns and a transmission percentage of 66.66%. Silicon nitride is thermally and radiation stable, and provides advantages in ease of processing and control of thickness to produce the proper $\pi$-phase shift. $Si_3N_4$ also has advantages in feasibility, effectiveness and maturity of silicon nitride fabrication technology.

The processing parameters of phase mask 52 are optimized to assure a low stress $Si_3N_4$ film used as a membrane, as well as to achieve a straight phase shifter sidewall slope. These results are produced by anisotopic etching and finer control over phase shifter thickness.

For an X-ray phase mask 52, the processing is started from a bare double polished 4-inch n-type silicon wafer. Pre-furnace cleaning is conducted on the wafers to remove organic and inorganic contamination. Next, an oxidation tube is used to deposit a thin layer (100 nm) of thermal oxide at 900° C. for 60 minutes. Low pressure chemical vapor deposition (LPCVD) is then employed, resulting a thickness of silicon nitride of 1.8+/-10% $\mu$m. This layer of silicon nitride is used as the membrane of the X-ray mask. A layer of oxide is then deposited on the front side of the wafer using plasma-enhanced-chemical-vapor deposition (PECVD). Or, more preferably, to enhance the quality of the etch stop, a layer of high quality poly-silicon is deposited on both sides of the wafer by LPCVD. The wafers are then transferred to an oxidation furnace where a dense oxide is formed on the nitride. The resulting oxide thickness is 100 nm, and this layer is used as the etching stop. LPCVD is then used to deposit a thin layer (1.27+/-10% $\mu$m) of silicon nitride, which is later used as the phase shifting layer. Thereafter, a 30 KV E-beam writer is used to pattern the phase shifting layer. A negative tone photoresist is preferably used. To transfer the pattern from the E-beam patterned photoresist into the phase shifting layer, plasma etching is used. Finally, the photoresist is stripped.

Next, as mentioned previously, the mask-to-wafer gap (distance d in FIG. 2) is ideally as small as possible to achieve optimum CD when producing nano-electronic structures because minimizing the gap correspondingly minimizes diffraction of the radiation. However, the smaller mask-to-wafer gap "d" creates significant production problems, including the fact that the mask and wafer are not perfectly flat, etc. Notwithstanding these mask-to-wafer gap concerns, the preferred embodiment, unlike previous systems, allows phase shifting lithography of sub-50 nm structures at mask-to-wafer gaps greater than 20 $\mu$m.

Figure 5:
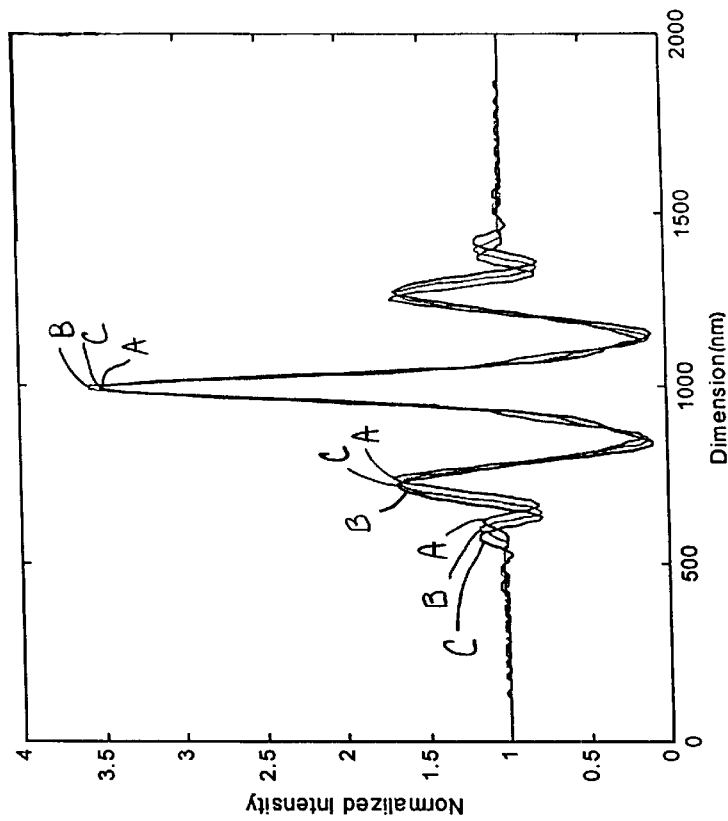
FIG. 5 is a graph illustrating aerial images similar to FIG. 3B, for a three different gap distances of 25, 30, and 35 microns between the phase shifting mask and the target.

Turning to FIG. 5, the aerial image 100 plotted as shown in FIG. 3B is shown for a series of three different mask-to-wafer gaps. More particularly, the curve marked "A" illustrates the image at a mask-to-wafer gap distance d of 25 $\mu$m, while curve "B" illustrates the aerial image at 30 $\mu$m and curve "C" illustrates the aerial image at 35 $\mu$m. One significant aspect of the preferred embodiment is illustrated by these curves by noting that the image bright peak generated by constructive interference produced by adjacent edges of two phase shift regions has a greater normalized intensity at greater mask-to-wafer gaps. In particular, a mask-to-wafer gap of 25 $\mu$m achieves a peak normalized intensity of less than 3.5 while a mask-to-wafer gap of 30 $\mu$m achieves a normalized intensity greater than or equal to 3.5. For a gap distance d equal to about 35 $\mu$m, however, the normalized intensity is reduced from the peak achieved at a gap distance d equal to 30 $\mu$m. Nevertheless, the bright peak intensity achievable at 40 $\mu$m is comparable to that at a gap distance of 25 $\mu$m. In sum, as shown in FIGS. 4 and 5. greater resolution of the CD of nano-electronic devices can be achieved with increasing mask-to-wafer gaps in the preferred embodiment. Notably, a gap spacing equal to or greater than 30 $\mu$m greatly reduces the potential for damaging the mask during process, and the relative insensitivity of the intensity at larger gaps lessens the requirements for gap control during exposure when writing the features of the mask and provides better processing latitude.

The above-referenced bright peak constructive interference technique can be applied to imaging two-dimensional images. In accordance with the preferred embodiment with an other preferred embodiment, two-dimensional nano-electronic nodes, such as contact holes, on the order of 50 nm in diameter can be fabricated with a rectangular mask feature, as shown in FIGS. 6, 7, and 8.

Figure 6:
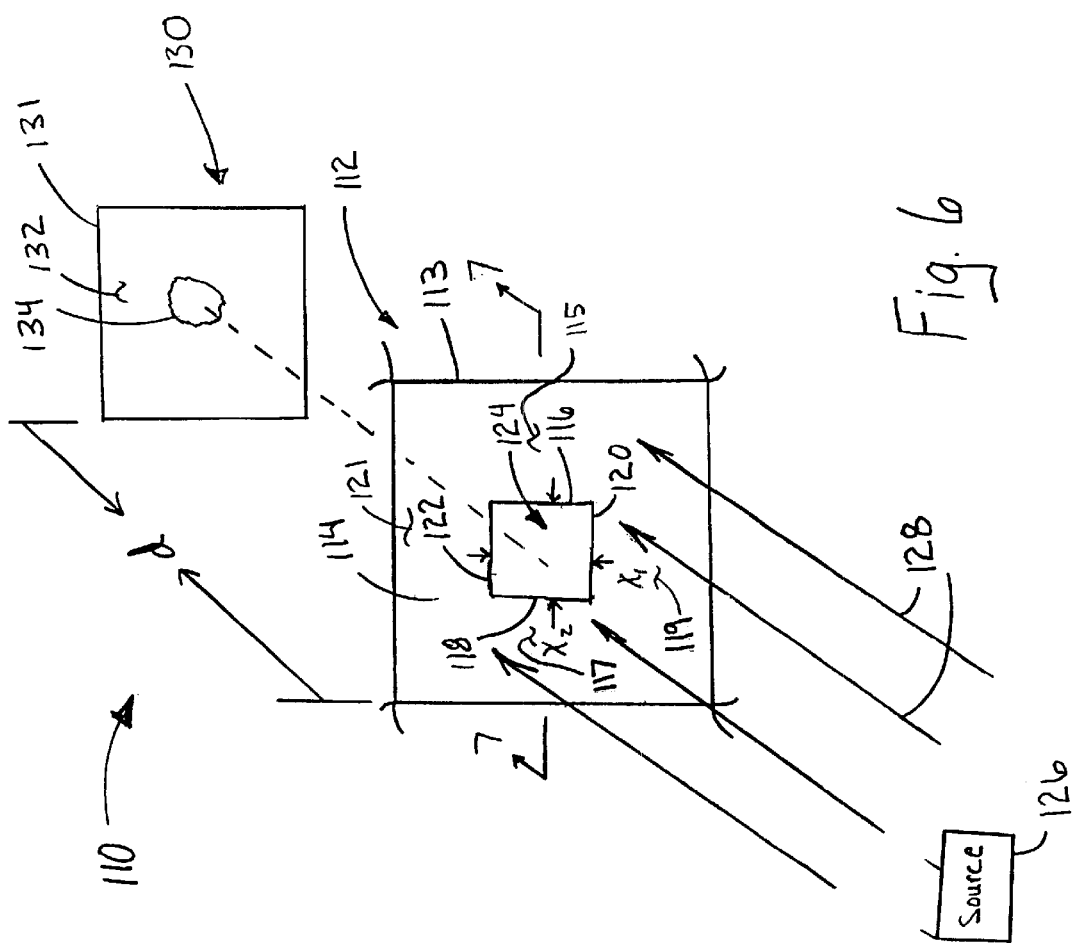
FIG. 6 is a schematic perspective view of a lithography apparatus utilizing a two-dimensional phase shifting mask according to the preferred embodiment.
Figure 7:
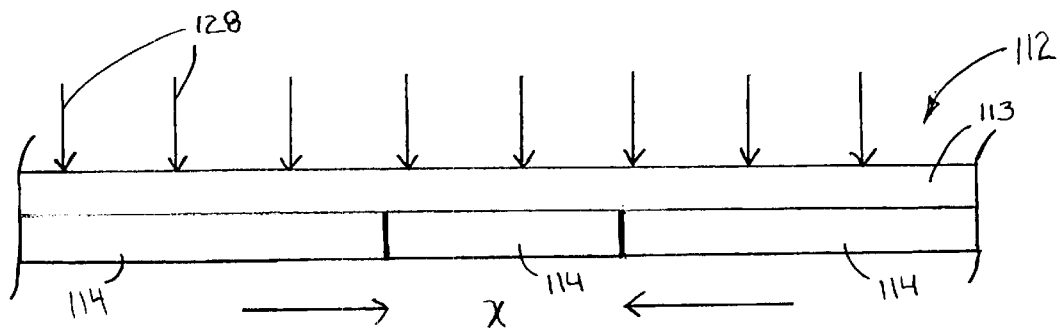
FIG. 7 is a schematic cross-sectional view of the phase shifting mask shown in FIG. 5, taken along the lines 6—6.

Turning initially to FIG. 6, a schematic illustration of a lithography apparatus 110 including aphase shift mask 112 having a membrane 113, that supports a layer of phase shift material 114 is shown. phase shift material 114 is written to define four phase shift regions 115, 117, 119, 121 defining four corresponding edges, 116, 118, 120, 122, respectively of the two-dimensional features. Edges 116, 118, 120, 122, comprise two opposed pairs of edges 116, 118, and 120, 122, that are positioned to define a rectangular aperture or open region 124 that defines a mask feature (e.g., a contact hole or via). Opposed edges 116, 118 and 120, 122, similar to the edges of mask 52 for imaging one-dimensional nodes, are separated by a selected spacing x to achieve optimum constructive interference of the edge bright peaks associated with edges 116, 118, 120, 122, as described below. When utilizing an X-ray source 126 (FIG. 6) that produces radiation 128 having a wavelength that is approximately 1 nm, the spacing between the edges of the opposed phase shift regions 115, 117 and 119, 121 is preferably about 100 nm–300 nm, and more preferably about 250 nm, as shown in the cross-sectional view of mask 112 in FIG. 7. During an imaging operation, radiation 128 propagates through aperture 124 formed by phase shift material 114 of mask 112 and impinges on a layer of photoresist 132 supported by a substrate 131 of target 130, thus imaging a contact hole 134 in resist 132.

Figure 8:
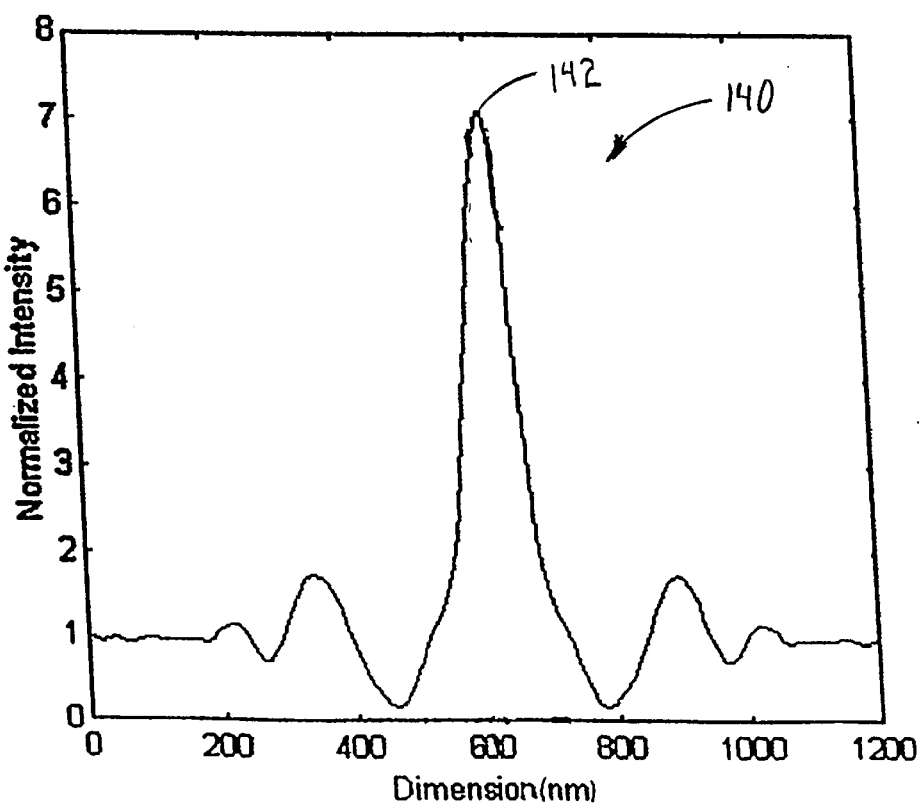
FIG. 8 is a graph illustrating an aerial image generated when using the phase shifting mask shown in FIGS. 5 and 6.

A mask-to-wafer gap of approximately 30 $\mu$m achieves an aerial image 140 shown in FIG. 8. As in the previous embodiment pertaining to FIG. 3B, each edge 116, 118, 120, 122, of phase mask 112 contributes an edge bright peak (not shown) to aerial image 140 generated during process. By positioning edges so that they define a square aperture 124 having 250 nm sides (i.e., so $x_1$, and $x_2$ each equal 250 nm), these corresponding edge bright peaks constructively interfere to form an image bright peak 142 having a normalized intensity of greater than or equal to seven, i.e., to form an image bright peak having an enhanced intensity relative to the intensity of both edge bright peaks individually. This image bright peak 142 is the used to produce a contact hole image 134 that has a diameter less than 50 nm. In effect, the aperture 124 defined by the phase shift material 114 increases the image bright peak by four-fold due to the constructive interference between the four edge bright peaks associated with the four edges 116, 118, 120, 122.

Again, such an arrangement produces a reduction in the wafer image from the mask feature by a factor of 3–5 (i.e., 250 nm feature can be used to create a 50 nm image), depending on the spacing and construction of the phase mask. Further, a high intensity positive-tone resist is preferably employed for two-dimensional feature imaging using the mask 112 shown in FIGS. 6 and 7. Notably, the ability of apparatus 110 to image sub-50 nm two-dimensional nano structures, is currently limited only by the physical properties of the materials used in the layers of the integrated circuit. For example, copper-filled vias experienced conduction problems at sub-50 nm diameters.

While the embodiments illustrated in the figures and described above are presently preferred, it should be understood that these embodiments are offered by way of example only. The invention is not intended to be limited to any particular embodiment, but is intended to extend to various modifications that nevertheless fall within the scope of the appended claims.

What is claimed is:

1. An X-ray phase mask comprising:
  a membrane having generally planar top and bottom surfaces, said membrane being substantially transparent to X-rays;
  a pair of clear phase shift regions supported on said membrane, each said region defining a corresponding edge; and
  wherein, during an imaging operation, the mask generates an aerial image defining, for each said corresponding edge, an edge bright peak and an edge dark peak, and wherein said edge bright peaks constructively interfere to form an image bright peak.

2. The X-ray phase mask according to claim 1, wherein said phase shift regions are made with a $\pi$-phase shift material.

3. The X-ray phase mask according to claim 2, wherein said $\pi$-phase shift material is a semiconductor material.

4. The X-ray phase mask according to claim 3, wherein said semiconductor material is $Si_3N_4$.

5. The X-ray phase mask according to claim 1, wherein said edges of said phase shift regions are separated by a perpendicular distance that is based on an effective wavelength of the X-rays.

6. The X-ray phase mask according to claim 5, wherein said perpendicular distance is between about 100 nm and 300 nm when the effective wavelength is about 0.9 nm.

7. The X-ray phase mask according to claim 1, wherein said phase shift regions are supported on said bottom surface of said membrane.

8. The X-ray phase mask according to claim 1, wherein said membrane is made of $Si_3N_4$.

9. The X-ray phase mask according to claim 1, wherein said membrane is made of diamond.

10. The X-ray phase mask according to claim 1, wherein the image bright peak is used to produce a nanostructure having a critical dimension less than or equal to 50 nm.

11. The X-ray phase mask according to claim 1, wherein the X-rays are generated by a synchrotron X-ray source.

12. An X-ray phase mask comprising:
  a membrane having generally planar top and bottom surfaces, said membrane being substantially transparent to X-rays;
  an open region defined by clear phase shifting material supported by said membrane, said phase shifting material defining a pair of adjacent edges separated by a perpendicular distance; and
  wherein an aerial image produced by the mask during an imaging operation defines a pair of edge bright peaks associated with said adjacent edges, and wherein said perpendicular distance is selected to facilitate constructive interference of said edge bright peaks.

13. A phase mask comprising:
  a membrane having generally planar top and bottom surfaces;
  clear phase shifting material supported by said membrane and defining an open region, wherein said open region defines a feature of the mask; and
  wherein, during an imaging operation, radiation propagating through said mask constructively interferes to produce an image bright peak that images the feature in a target photoresist.

14. A method of imaging a feature by X-ray lithography, the method comprising:
  providing an X-ray phase mask having a membrane with generally planar top and bottom surfaces, the membrane being substantially transparent to X-rays;
  supporting a pair of clear phase shift regions on said membrane, said phase shift regions each defining a corresponding edge;
  providing a target including a layer of X-ray sensitive photoresist on a substrate;
  positioning the target generally parallel to and spaced from the mask, wherein the distance between the target and the mask defines a gap;

directing a beam of substantially collimated X-rays through the mask so as to generate a pair of edge bright peaks associated with the corresponding edges, wherein said edge bright peaks constructively interfere to generate an image bright peak; and using the image bright peak to image the feature on the photoresist.

15. The method according to claim 14, wherein the gap is greater than 25 nm.

16. A method according to claim 15, further including the step of increasing the gap between the mask and the target so as to improve the resolution of the image.

17. The method according to claim 14, wherein the photoresist is a positive-tone photoresist.

18. The method according to claim 14, wherein said corresponding edges are separated by a perpendicular distance.

19. The method according to claim 18, wherein said perpendicular distance is about 250 nm when an effective wavelength of the X-rays is about 0.9 nm.

20. The method according to claim 14, wherein the X-rays are generated by a synchrotron X-ray source.

21. The method according to claim 14, wherein the membrane is made of $Si_3N_4$.

22. The method according to claim 14, wherein the membrane is made of silicone carbide.

23. A method of producing a nanostructure by lithography, the method comprising:

providing a phase shifting mask defining a feature;

providing a target positioned parallel to the mask and separated therefrom by a gap;

exposing the phase shifting mask and the target to a beam of radiation such that the corresponding aerial image includes an image bright peak; and using the image bright-peak to image the feature on the target.

24. The method according to claim 23, wherein the feature is defined by a window.

25. The method according to claim 24, wherein the window is defined by a pair of clear π-phase shift regions, each region defining a corresponding edge, the corresponding edges being generally parallel and separated by a distance.

26. The method according to claim 25, wherein the image bright peak is produced by constructive interference between a pair of edge bright peaks associated with the corresponding edges.

27. The method according to claim 25, wherein the beam of radiation is generated by an X-ray source.

28. The method according to claim 27, wherein the X-ray source is a synchrotron X-ray source.

29. The method according to claim 27, wherein the distance is between about 100 nm and 300 nm when the effective wavelength of the radiation of the beam is about 0.9 nm.

30. The method according to claim 29, wherein the distance is about 250 nm.

31. The method according to claim 29, wherein the gap is greater than or equal to 25 nm.

32. The method according to claim 31, further including the step of increasing the gap so as to improve the resolution of the image.

33. A phase shifting mask for imaging a feature on a target, the mask comprising:

a membrane having generally planar top and bottom surfaces;

a pair of clear phase shift regions supported on said membrane, each said region defining a corresponding edge; and wherein, during an imaging operation, the mask generates an aerial image defining a bright peak that is used to image the feature.

34. A phase shifting mask for imaging a feature on a target, the mask comprising:

a membrane having generally planar top and bottom surfaces;

first and second clear phase shift regions supported on said membrane, wherein said first and second regions define corresponding first and second edges; and wherein said first and second edges are separated by a distance selected so that an aerial image generated by the mask during an imaging operation includes corresponding first and second bright peaks that constructively interfere, said first and second bright peaks corresponding to said first and second edges.

35. The phase shifting mask of claim 34, further including a radiation source positioned to direct radiation generally parallel to said edges and through the mask so as to generate the aerial image.

36. The phase shifting mask of claim 35, wherein said radiation source is an X-ray source.

37. The phase shifting mask of claim 36, wherein the X-ray source is a synchrotron X-ray source.

38. The phase shifting mask of claim 36, wherein said distance is between 100 nm and 300 nm.

39. The phase shifting mask of claim 38, wherein said distance is 250 nm.

40. The phase shifting mask of claim 34, wherein the mask and the target are separated by a gap distance.

41. The phase shifting mask of claim 40, wherein said gap distance is greater than 25 μm.

42. The phase shifting mask of claim 34, wherein said membrane is made of diamond.

43. A phase shifting mask that images a two-dimensional feature on a target, the phase shifting mask comprising:

a membrane;

clear phase shifting material supported by said membrane, said phase shifting material defining an aperture wherein said aperture includes two pairs of opposed edges, each pair of opposed edges being separated by an associated perpendicular distance; and wherein, during an imaging operation, the mask generates an aerial image comprising an edge bright peak associated with each said edge, and wherein each said associated perpendicular distance is selected to facilitate constructive interference of the edge bright peaks to produce an image bright peak.

44. The phase shifting mask of claim 43, wherein said aperture is square-shaped.

45. The phase shifting mask of claim 43, wherein said phase shifting material produces a π-phase shift.

46. The phase shifting mask of claim 45, wherein said phase shifting material is $Si_3N_4$.

47. The phase shifting mask of claim 45, wherein said phase shifting material is SiC.

48. The phase shifting mask of claim 43, further including a radiation source positioned to direct radiation generally parallel to said edges and through the mask so as to generate the aerial image.

49. The phase shifting mask of claim 48, wherein each said perpendicular distance is based on the effective wavelength of the radiation generated by said radiation source.

50. The phase shifting mask of claim 49, wherein said radiation source is an X-ray source.

51. The phase shifting mask of claim 50, wherein said X-ray source is a synchrotron X-ray source.

52. The phase shifting mask of claim 50, wherein each said perpendicular distance is between 100 nm and 300 nm.

53. The phase shifting mask of claim 52, wherein each said perpendicular distance is about 250 nm when the effective wavelength is about 0.9 nm.

54. The phase shifting mask of claim 43, wherein the phase shifting mask and the target are parallel and separated by a gap distance.

55. The phase shifting mask of claim 54, wherein the gap distance is equal to or greater than 25 nm.

56. The phase shifting mask of claim 43, wherein the two-dimensional feature is a contact hole.

57. The phase shifting mask of claim 43, wherein the membrane is made of SiC.

58. The phase shifting mask of claim 43, wherein the membrane is made of $Si_4N_4$.

59. The phase shifting mask of claim 43, wherein the membrane is made of diamond.

60. A method of imaging a two-dimensional mask feature by lithography, the method comprising:

providing a phase shifting mask defining a two-dimensional feature;

providing a target positioned parallel to the mask and separated therefrom by a gap;

exposing the phase shifting mask and the target to a beam of radiation such that a corresponding aerial image includes an image bright peak; and using the image bright peak to image the two-dimensional feature on the target.

61. The method according to claim 60, wherein the mask includes a membrane and a clear phase shifting material supported by the membrane, and wherein the feature is defined by an aperture.

62. The method according to claim 61, wherein the aperture is defined by two pairs of opposed π-phase shift regions, each phase shift region defining a corresponding edge, the corresponding edges of each said pair being generally parallel to each other and separated by a distance.

63. The method according to claim 62, wherein the image bright peak is produced by constructive interference between four edge bright peaks associated with the corresponding edges.

64. The method according to claim 62, wherein the beam of radiation is generated by an X-ray source.

65. The method according to claim 64, wherein the X-ray source is a synchrotron X-ray source.

66. The method according to claim 62, wherein the distance is between about 100 nm and 300 nm when the effective wavelength of the radiation of the beam is about 0.9 nm.

67. The method according to claim 66, wherein the distance is about 250 nm.

68. The method of claim 61, wherein the membrane is made of $Si_3N_4$.

69. The method of claim 61, wherein the membrane is made of diamond.

70. The method of claim 61, wherein the membrane is made of SiC.

71. The method according to claim 60, wherein the gap is equal to or greater than 25 nm.

72. The method of claim 71, further including the step of increasing the gap so as to improve the resolution of the image.

* * * * *

UNITED STATES PATENT AND TRADEMARK OFFICE
CERTIFICATE OF CORRECTION

PATENT NO.     : 6,428,939 B1
DATED          : August 6, 2002
INVENTOR(S)    : Lei Yang et al.

It is certified that error appears in the above-identified patent and that said Letters Patent is hereby corrected as shown below:

Column 1,
Line 5, insert the following:

-- REFERENCE TO GOVERNMENT GRANT

This invention was made with United States government support awarded by the following agencies: DOD AMDA972-99-1-0013. The United States has certain rights in this invention. --

Signed and Sealed this

Thirty-first Day of December, 2002

JAMES E. ROGAN
*Director of the United States Patent and Trademark Office*